(12) United States Patent
Villain

(10) Patent No.: US 8,526,883 B2
(45) Date of Patent: Sep. 3, 2013

(54) RF SWITCH FOR AN RF SPLITTER

(75) Inventor: Frederic Francois Villain, Caen (FR)

(73) Assignee: NXP, B.V., Eindhoven (NL)

( * ) Notice: Subject to any disclaimer, the term of this patent is extended or adjusted under 35 U.S.C. 154(b) by 266 days.

(21) Appl. No.: 12/997,582

(22) PCT Filed: Jun. 11, 2009

(86) PCT No.: PCT/IB2009/052489
§ 371 (c)(1),
(2), (4) Date: Dec. 10, 2010

(87) PCT Pub. No.: WO2009/150625
PCT Pub. Date: Dec. 17, 2009

(65) Prior Publication Data
US 2011/0090022 A1    Apr. 21, 2011

(30) Foreign Application Priority Data

Jun. 13, 2008   (EP) .................................. 08290556

(51) Int. Cl.
*H04B 7/00* (2006.01)
*H04B 1/10* (2006.01)
*H04B 1/26* (2006.01)
*H01H 53/00* (2006.01)

(52) U.S. Cl.
USPC ........... 455/41.2; 455/69; 455/311; 455/313; 455/323; 335/4

(58) Field of Classification Search
USPC ............... 327/7, 77, 308–310, 328, 102, 100, 327/435; 330/9, 295; 455/234, 333, 41.2, 455/69, 311, 313, 323; 333/101, 103; 725/106; 323/282–285; 335/4
See application file for complete search history.

(56) References Cited

U.S. PATENT DOCUMENTS

| | | | |
|---|---|---|---|
| 4,373,139 A * | 2/1983 | Beesley | 327/77 |
| 5,087,893 A | 2/1992 | Petersen et al. | |
| 5,767,721 A * | 6/1998 | Crampton | 327/308 |
| 6,903,596 B2 * | 6/2005 | Geller et al. | 327/427 |
| 7,167,090 B1 | 1/2007 | Mandal et al. | |
| 7,215,162 B2 * | 5/2007 | Mizuno et al. | 327/102 |
| 7,276,938 B1 * | 10/2007 | Wert | 326/81 |
| 7,295,154 B2 * | 11/2007 | Walton et al. | 342/194 |
| 7,530,091 B2 * | 5/2009 | Vaughan | 725/106 |
| 7,619,462 B2 * | 11/2009 | Kelly et al. | 327/427 |

(Continued)

FOREIGN PATENT DOCUMENTS

| | | |
|---|---|---|
| GB | 2305015 A | 3/1997 |
| WO | 9955085 A2 | 10/1999 |
| WO | 01/74000 A1 | 10/2001 |
| WO | 03071680 A1 | 8/2003 |

OTHER PUBLICATIONS

International Search Report and Written Opinion for Application PCT/IB2009/052489 (Sep. 28, 2009).

*Primary Examiner* — Bao Q Vu
*Assistant Examiner* — Yusef Ahmed

(57) ABSTRACT

An RF switch for an RF splitter is disclosed, in which the bias voltage for the RF switching elements can be supplied, by using an RF to DC translator, from the RF signal on the input side to the switch. By using a native NMOS switch, routing of the RF signal is thus enabled without the necessity for an external power supply.

7 Claims, 2 Drawing Sheets

(56) References Cited

U.S. PATENT DOCUMENTS

| | | | |
|---|---|---|---|
| 7,852,172 B2 * | 12/2010 | Arell et al. | 333/101 |
| 7,936,218 B1 * | 5/2011 | Lautzenhiser et al. | 330/295 |
| 2003/0169092 A1 * | 9/2003 | Zuk | 327/391 |
| 2006/0015921 A1 | 1/2006 | Vaughan | |
| 2007/0236851 A1 * | 10/2007 | Shameli et al. | 361/113 |
| 2007/0296504 A1 * | 12/2007 | Rabjohn et al. | 330/297 |

* cited by examiner

RF SWITCH FOR AN RF SPLITTER

FIELD OF THE INVENTION

This invention relates to RF splitter modules, and in particular to RF switches forming part of such splitter modules.

BACKGROUND OF THE INVENTION

RF splitter modules are commonly used in fields of application such as CATV (community antenna television) distribution systems, in which a single RF antenna and input is used for multiple purposes. A typical such application is shown in FIG. 1, which depicts an example RF front-end of a DVD-R (Digital Video Disk Recorder) system. The RF front end comprises a RF input 1 which is connected to RF output 2 and 3 by means of amplifiers A and B respectively. Bypass switch 4 is connected in parallel with amplifier B, in order to provide a switchable bypass route for bypassing amplifier B. Thus output 2 forms the RF output for the device tuner, whilst output 3 provides an RF loop-through output. The bypass switch enable the output 3 to be an amplified version of the signal at input 2, or a copy of the input. In the latter instance, it is preferred that the output copy suffers little or no degradation with respect to the input.

Other example applications which require a similar RF splitter include multi-tuner cable set-top boxes, cable splitter modules, multi-tuner televisions, and home gateways. Conventionally, a discreet passive splitter is used followed by separate fixed gain amplifiers, although it would in many instances be preferable to include an RF switch in order to bypass an amplifier or attenuator In FIG. 1, the outputs have been shown as tuner output, and loop-through output. However in different applications, the created output paths may include such diverse modules as main picture tuners, picture-in-picture (PIP) tuners, digital video recorder (DVD-R), and cable modems (CM).

In the prior art, switch 4 typically comprises a depletion mode MOSFET which is introduced into the splitter module as a separate, or external, component. An example of such a MOSFET which is suitable for this application is the device BF1108 silicon RF switch supplied by NXP Semiconductors; other similar such low-loss RF switching MOSFETs are also available.

The presence of such an external switch requires that power is supplied to the splitter device. However, it is desirable that when the device is in standby mode, the power consumption is minimised. There is thus an ongoing need for an RF switch which forms part of an RF splitter device, which consumes little or no power when the device is in standby mode, but still provides a bypass function.

SUMMARY OF THE INVENTION

It is an object of the present invention to provide an RF switch for use in an RF splitter module which requires zero DC power for its operation.

According to the present invention there is provided an RF switch having an input and an output and a switching element characterised by a threshold voltage therebetween, wherein the switching element comprises a native transistor. A native transistor, that is to say one which has a zero or near-zero threshold voltage (Vth) is particular suited to this application since either no DC bias, or only a small DC bias, is required to exceed the threshold voltage.

Preferably, the RF switch further comprises an RF-to-DC-converter electrically connected to the input and being capable of supplying a bias voltage to the switching element which is greater than the threshold voltage. This facilitates the use of a switching element with a non-negative threshold voltage, Vth.

Preferably the switching element comprises an NMOS transistor. Beneficially, these transistors frequently form part of standard process libraries, and do not require extra masks or post-processing. Furthermore, NMOS is a technology capable of providing native transistors which have truly negative threshold voltages.

Preferably the RF-to-DC converter is adapted for operation without an external power supply, and in a preferred embodiment, the RF-to-DC converter comprises a capacitor and diode network. Such a converter enables advantage to be taken of the full benefit of the absence of a requirement for external DC supply to the switch.

Preferably the switching element is adapted to maintain a closed state in the presence of an RF signal at the input and the absence of external power. Furthermore, preferably the RF switch further comprises clamping means for maintaining the switching element in an open state in the presence of external power. Thus, when the device is powered, the bypass switch may be held open.

Preferably the clamping means comprises a resistor network. A suitable resistor network, particularly one which includes high values for the resistors, is cable of clamping the switching element without drawing a high power from the supply.

According to another aspect of the invention there is provided an RF splitter including a loop-through channel having an amplifier which is arranged to be capable of being bypassed by means of an RF switch as described above. Preferably the RF switch is integrated with the amplifier. This provides a particularly cost-effective and space-effective solution.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
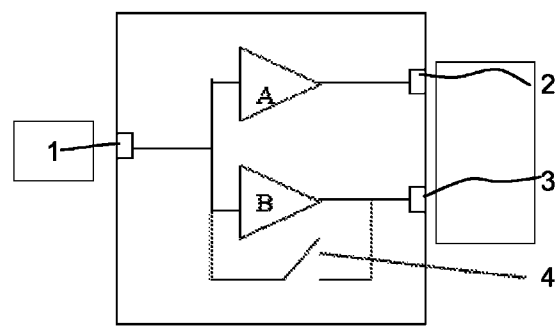
FIG. 1 depicts a typical RF front-end of a DVD-R.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 2:
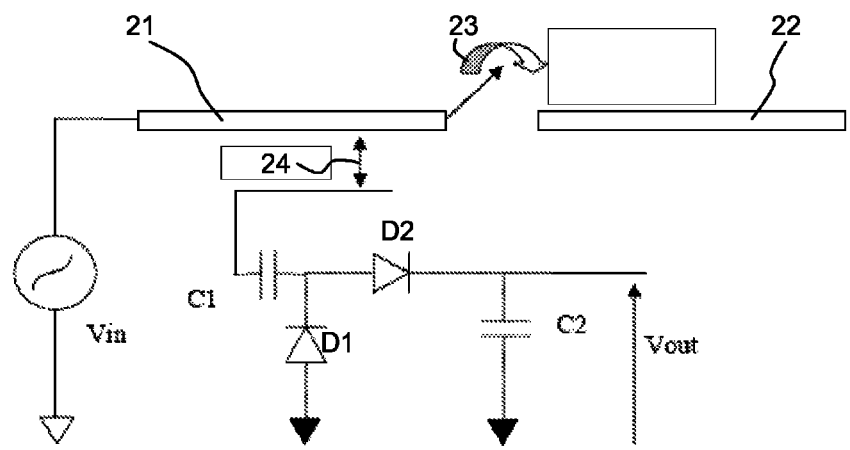
FIG. 2 shows a schematic of a circuit diagram to provide an RF-to-DC translator, for powering an RF switch.

The basic concept underlying the invention is illustrated in FIG. 2. FIG. 2 depicts an RF transmission line 21, 22 characterised in that the input end 21 of the line is switchably connectable to the output 22 end of the line by means of an RF switch 23. The RF input end 21 of the line is connectable by means of an aerial or the like (not shown) to an RF signal Vin. By means of a coupling 24, the RF input end 21 of the line is coupled to an RF-to-DC translator. The RF-to-DC translator comprises a network of capacitors C1, C2 and diodes D1, D2.

Figure 3:
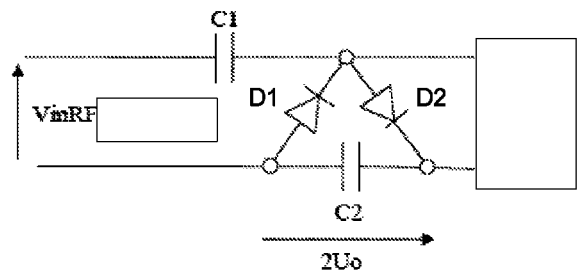
FIG. 3 shows another aspect of the RF-to-DC translator of FIG. 3.

The operation of the RF-to-DC translator network is shown more clearly in FIG. 3. FIG. 3 shows an RF input (Vin RF) which is the RF signal coupled to the translator by coupling 24. The Vin RF input signal has an amplitude Uo and may be represented as Uosin(wt). In the RF-to-DC translator, capacitor C1 which is connected in series with the input, provides a DC isolation for the translator. The two are series connected, their midpoints being connected to the output of isolation capacitor C1. The other, second, end of first capacitor D1 is connected to the ground of the input signal. The other end of D2 is connected to this second end of D1 via a series capacitor C2. Thus diode D1, D2 and capacitor C2 form a triangular network, with isolation capacitor C1 being connected to the apex of the triangle, and series capacitor C2 forming the base of the triangle. Due to the configuration of this network, a DC voltage results across capacitor C2. The resulting DC voltage is equivalent to the full swing of the oscillating RF input voltage, and thus has a magnitude of 2 Uo.

Figure 4:
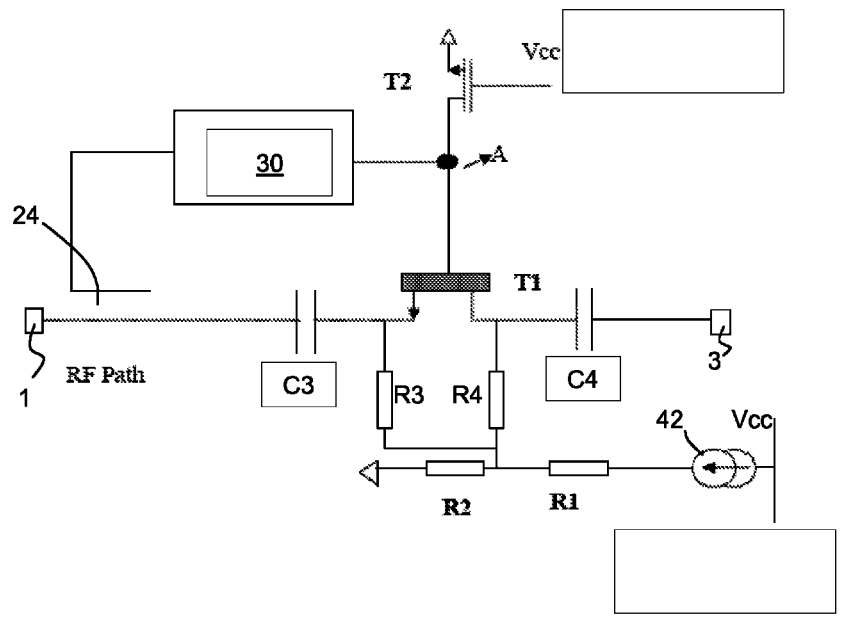
FIG. 4 shows an example implementation of a bypass switch based on a native MOS.

The implementation of the RF-to-DC translator depicted in FIGS. 2 and 3, in a RF switch according to an embodiment of the invention, is shown in FIG. 4. FIG. 4 shows part of the RF path inside an RF splitter module such as that shown in FIG. 1, between RF input 1 and RF output 3. Connected in series between input 1 and output 3 there are DC isolation capacitors C3 and C4, and connected between capacitors C3 and C4 there is RF switch 23, which in this implementation is shown at MOSFET T1. Gate of MOSFET T1 is connected at node A to the output of RF-to-DC translator 30, the input to which is coupled to the RF path at coupling 24. Since the input to RF-to-DC translator 30 is coupled to the input end of the RF path, it is always enabled whenever there is an RF signal at input 1. Thus, the operation of RF-to-DC converter 30 is not dependent on the state of the switch T1: that is to say, RF-to-DC translator 30 provides a bias to the gate node A of T1 whenever there is an RF signal present at input 1, irrespective of the state of power of the module.

In addition to being connected to the output of the RF-to-DC translator, gate node A of switch T1 is also connected to DC ground of the device by means of transistor T2. Thus the drain of T2 is connected to node A, and the source to DC ground. The gate of transistor T2 is connected to the supply voltage for the module, Vcc.

Thus in operation, when there is present a supply voltage Vcc, node A will be grounded through transistor T2, irrespective of any output voltage from the RF-to-DC translator. Thus, by suitable biasing of the drain and source of switch T1, which will be described hereafter, the gate-source voltage of T1 (Vgs) can be maintained lower than the threshold voltage of the transistor (Vth).

Biasing of the drain and source of transistor T1 is effected by means of resistor network R1, R2, R3 and R4. High impedance resistors R1 and R2 are connected between the supply rain VCC, acting as current source 42, and ground. R1 and R2 thus act as a voltage divider, and the common terminal between them is connected by means of resistors R3 and R4 to the source and drain respectively of RF switch T1.

Thus in operation, when the module is turned ON, there is present the supply voltage Vcc. The resistor network R1, R2, R3 and R4 biases T1 such that its source is at a positive voltage, and since its gate is clamped to ground be means of T2, its gate-source voltage (Vgs) is negative. Therefore, since the transistor is a native NMOS and so Vth is approximately zero, then Vgs is less than its threshold voltage (Vth) That is, Vgs<Vth. Thus the native MOS transistor T1 will be tuned off, and the RF path between input 1 and output 3 is disabled.

In contrast, however, when the splitter module is turned OFF, Vgs is not so biased, and due to the RF-to-DC translator 30, Vgs>Vth. Thus the transistor T1 is switched on, and the RF path between input 1 and output 3 is complete.

Use of a native MOS transistor, such as described above, is particularly convenient since such transistors have a very low, or zero, threshold voltage Vth, which relaxes the requirement for a high level of coupling at coupler 24, which could otherwise result in degradation of the RF signal. An example such native N-MOS transistor with gate length of 180 m, available as a standard library component from NXP Semiconductors, has a nominal threshold voltage, also termed pinch-off voltage, of Vth=−0.18V, and a worst case of Vth=−0.08V.

Although the above embodiment has been described in relation to a native NMOS transistor, the invention also encompasses a native PMOS transistor in place of the NMOS transistor. In this case, the PMOS FET is turned OFF when Vgs>Vth. So, to turn the PMOS native transistor ON, the DC to RF translator (which may be equivalently described as a DC to RF converter), should be connected to the source of the PMOS and its gate grounded. On the other hand, with the presence of a Vcc supply, to turn OFF the PMOS a positive voltage (Vgs>Vth) should be applied to its gate. The result will be similar to the embodiment based on an NMOS native transistor, described above.

In a further embodiment of the invention (not explicitly shown, but similar to that shown in FIG. 4), the RF to DC translator 30, and transistor T2 are not present, but the gate of the native transistor T1 is held at ground, by grounding node A. The native transistor T1, in case, has a definitely negative threshold voltage Vth; thus, since node A is grounded, it will be turned on whenever the module is un-powered: that is to say, in the absence of a supply voltage Vcc, T1 will be turned on. However, when a supply voltage Vcc is present, the voltage divider R1, R2, together with biasing resistors R3, R4, will bias both the drain and source of T1 positive, resulting in Vgs<Vth, and thus the transistor T1 will be pinched off.

From reading the present disclosure, other variations and modifications will be apparent to the skilled person. Such variations and modifications may involve equivalent and other features which are already known in the art of RF splitters and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. An RF switch comprising:
   an input;
   an output;
   a switching element, wherein the switching element has a threshold voltage of substantially zero;
   a loop-through channel having an amplifier which is configured to be bypassed by the RF Switch; and
   a Radio Frequency (RF) to Direct Current (DC) converter electrically connected to the input, configured to supply a bias voltage to the switching element which is greater than the threshold voltage, and configured to operate without an external power supply by receiving power from the loop-through channel.

2. The RF switch according to claim 1, wherein the switching element comprises an NMOS transistor.

3. The RF switch according to claim 1, wherein the RF-to-DC converter comprises a capacitor and diode network.

4. The RF switch according to claim 1, wherein the switching element is configured to maintain a closed state, in the presence of an RF signal at the input and absence of external power.

5. The RF switch according to claim 1, further comprising:
   a clamp configured to maintain the switching element in an open state in the presence of external power.

6. The RF switch according to claim 5, wherein the clamp comprises a resistor network.

7. The RF splitter according to claim 1, wherein the RF switch is integrated with the amplifier.

* * * * *